United States Patent [19]

Yin et al.

[11] Patent Number: 5,789,282
[45] Date of Patent: Aug. 4, 1998

[54] METHOD FOR FABRICATING THIN FILM TRANSISTOR

[75] Inventors: Sung Wook Yin; Tae Woo Kwon, both of Kyoungkido, Rep. of Korea

[73] Assignee: Hyundai Electronics Industries Co., Ltd., Kyoungkido, Rep. of Korea

[21] Appl. No.: 738,745

[22] Filed: Oct. 28, 1996

[30] Foreign Application Priority Data

Nov. 3, 1995 [KR] Rep. of Korea ............ 39630

[51] Int. Cl.[6] ........................... H01L 21/84
[52] U.S. Cl. ............ 438/159; 438/286; 438/554; 438/564
[58] Field of Search ............ 437/40–41, 160, 437/162; 438/158, 159, 286, 554, 564

[56] References Cited

U.S. PATENT DOCUMENTS

| | | |
|---|---|---|
| 4,603,468 | 8/1986 | Lam . |
| 4,628,589 | 12/1986 | Sundaresan . |
| 4,987,092 | 1/1991 | Kobayashi et al. ............ 437/57 |
| 5,024,959 | 6/1991 | Pfiester ............ 437/34 |
| 5,158,898 | 10/1992 | Hayden et al. ............ 437/21 |
| 5,348,897 | 9/1994 | Yen ............ 437/40 |
| 5,403,761 | 4/1995 | Rha . |
| 5,455,182 | 10/1995 | Nishimoto et al. ............ 437/21 |
| 5,468,662 | 11/1995 | Havemann . |
| 5,573,964 | 11/1996 | Hsu et al. ............ 437/40 |

*Primary Examiner*—John Niebling
*Assistant Examiner*—Richard A. Booth
*Attorney, Agent, or Firm*—Jacobson, Price, Holman & Stern, PLLC

[57] ABSTRACT

A method for fabricating a thin film transistor, comprising the steps of: forming a gate electrode; forming a doped polysilicon film for source/drain at the side wall of the gate electrode, to insulate the gate electrode; forming a gate insulating film; forming an amorphous polysilicon film over the resulting structure; and forming a source/drain region by diffusing the dopants of the doped polysilicon film into the amorphous silicon film, whereby it is possible to form the source/drain region and drain offset structure of a thin film transistor without formation of a source/drain mask and ion implantation and thus, thereby simplifying the overall procedure.

3 Claims, 4 Drawing Sheets

METHOD FOR FABRICATING THIN FILM TRANSISTOR

BACKGROUND OF THE INVENTION

1. Field of the invention

The present invention relates, in general, to a method for fabricating a thin film transistor and, more particularly, to a method by which a source/drain region and drain offset structure of a thin film transistor can be formed without formation of a source/drain mask and ion implantation.

2. Description of the Prior Art

Thin film transistors, most used as load elements in an SRAM device, comprise channel regions made of polysilicon. In recent, bottom-gate type thin film transistors in which gate electrodes are formed below the channel regions have been developed and most widely employed.

FIG. 1 shows a conventional method for fabricating a bottom-gate type transistor. According to this conventional method, a gate electrode 12 consisting of polysilicon is first formed on an interlayer insulating film 11, as seen in FIG. 1. A gate oxide film 13 is deposited over the gate electrode 12, followed by the deposition of a polysilicon film 14 for channel over the gate oxide film 13. Thereafter, using a lightly doped offset (LDO) mask, ions are implanted in a drain offset region 14c of the polysilicon film 14. Then, using a source/drain ion implantation mask, a source 14a/ drain 14d region is formed in the polysilicon film 14. Reference numeral 14b stands for a channel region.

Since the source/drain is formed by ion implantation in the conventional fabricating method of bottom-gate type thin film transistor, a process for forming a mask for source/drain ion implantation is necessarily accompanied. In addition, the formation of source/drain by ion implantation is found to be problematic in lowering the resistance of source/drain.

SUMMARY OF THE INVENTION

Therefore, it is an objective of the present invention to overcome the above problems encountered in prior arts and to provide a method for fabricating a thin film transistor by which a source/drain can be formed without ion implantation.

Based on the intensive and thorough research by the present inventors, the above objective could be accomplished by a provision of a method for fabricating a thin film transistor, comprising the steps of forming a gate electrode; forming a doped polysilicon film for source/drain at the side wall of the gate electrode, to insulate the gate electrode; forming a gate insulating film; forming an amorphous polysilicon film over the resulting structure; and forming a source/drain region by diffusing the dopants of the doped polysilicon film into the amorphous silicon film.

BRIEF DESCRIPTION OF THE DRAWINGS

The above and other objectives and aspects of the invention will become apparent from the following description of embodiment with reference to the accompanying drawings in which.

DETAILED DESCRIPTION OF THE PREFERRED EMBODIMENT

The application of the preferred embodiment of the present invention is best understood with reference to the accompanying drawings.

Referring to FIG. 2, there are stepwise illustrated thin film transistor fabricating processes according to an embodiment of the present invention.

Figure 1:
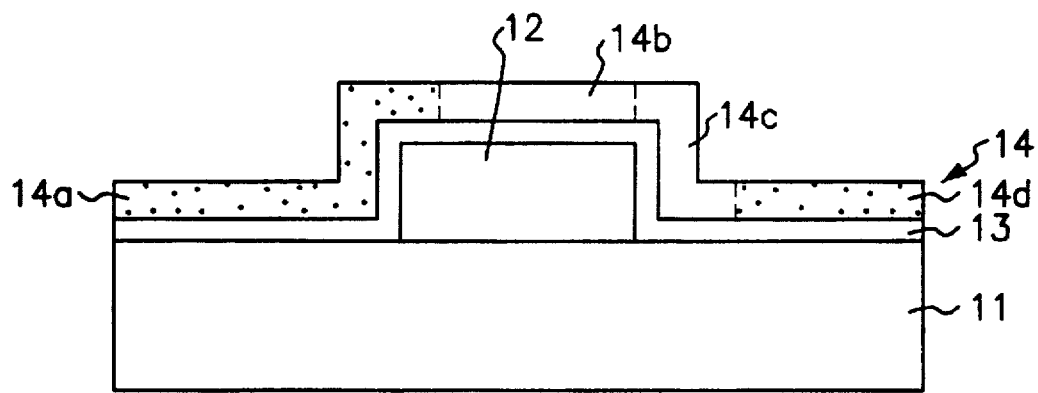
FIG. 1 is a schematic cross sectional view showing a conventional bottom-gate type thin layer transistor.
Figure 2A:
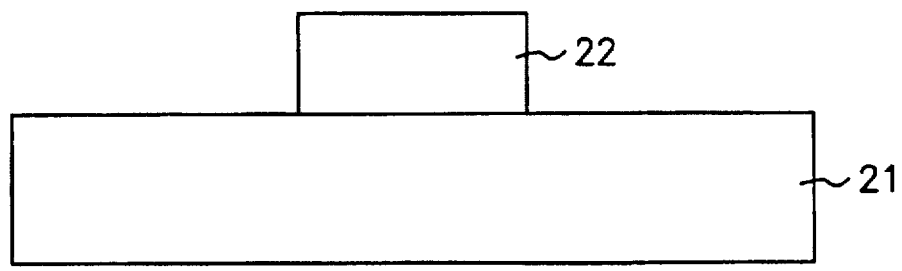
FIGS. 2A through 2F are schematic cross sectional view showing a method for fabricating a thin film transistor, according to the present invention.

First, on an oxide 21 serving as an interlayer insulating film, a gate electrode 22 of a thin film transistor is formed using polysilicon, as shown in FIG. 2A.

Figure 2B:
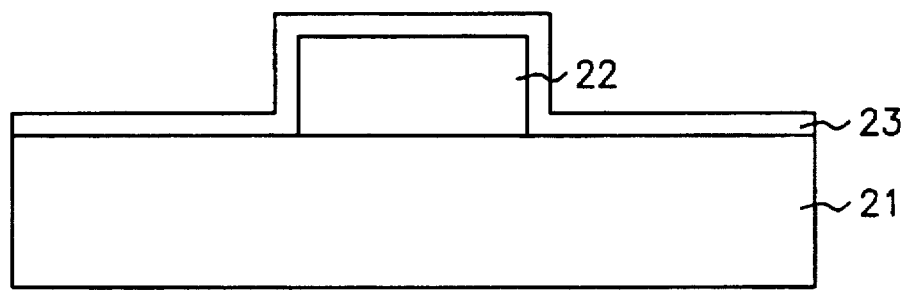

Then, an oxide film 23 is deposited over the resulting structure, which will function as an interlayer insulating film, as shown in FIG. 2B.

Figure 2C:
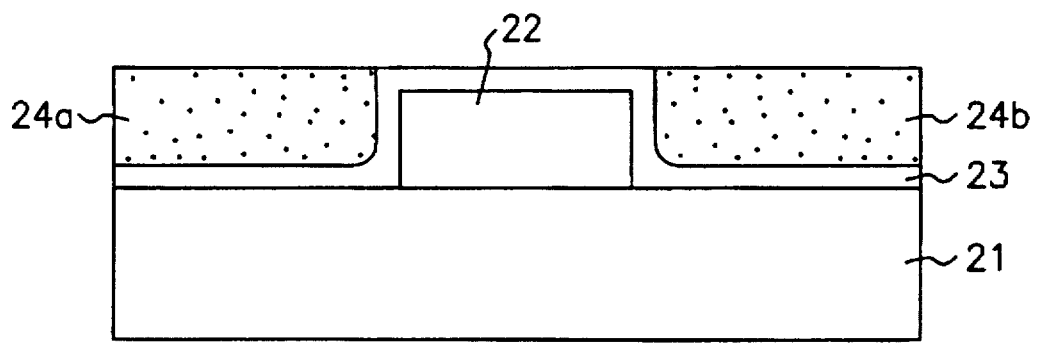

Next, a blanket doped polysilicon film is deposited and then, subjected to etch back, until the surface of the oxide film is exposed. In result, fragments of the doped polysilicon film, designated by reference numerals 24a and 24b remain only at the side wall of the gate electrode 22, as shown in FIG. 2C.

Figure 2D:
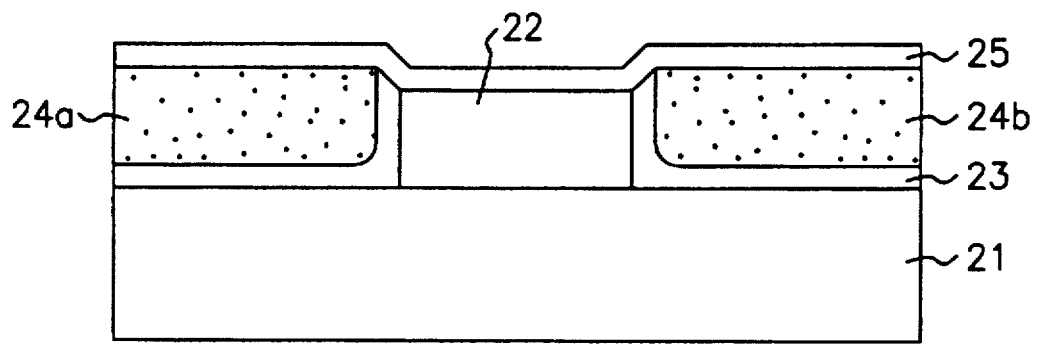

Subsequently, the exposed region of the oxide film 23, covering the upper surface of the polysilicon film 22, is removed by etch, followed by the formation of a gate oxide film 25 over the resulting structure, as shown in FIG. 2D. The exposed region of the oxide film 23 may be used as a gate oxide film as it is. However, considering that the properties of a thin film transistor are largely affected by the film qualities, such as the surface roughness of the gate oxide, it is preferred to form a quality oxide again.

Figure 2E:
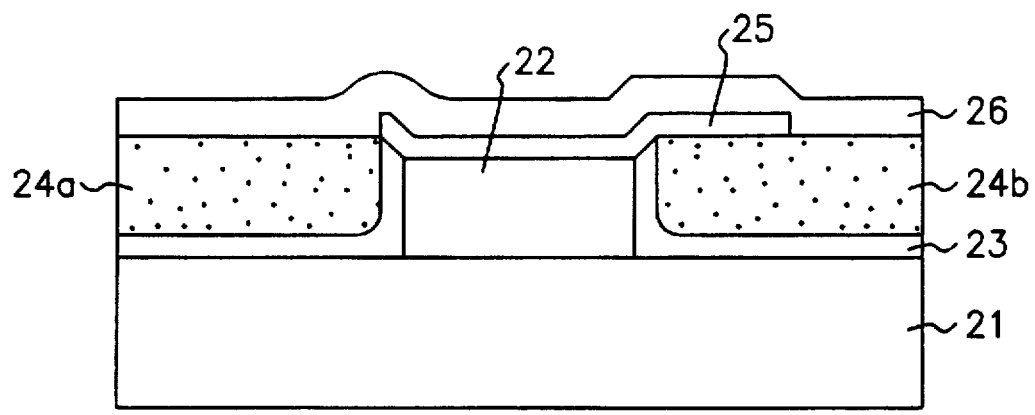

Thereafter, a mask is utilized to define the gate oxide film 25, in such a way that the oxide film remains only over the gate electrode 22 and the drain offset region, as shown in FIG. 2E. Then, an amorphous polysilicon film 26 is deposited over the resulting structure.

Figure 2F:
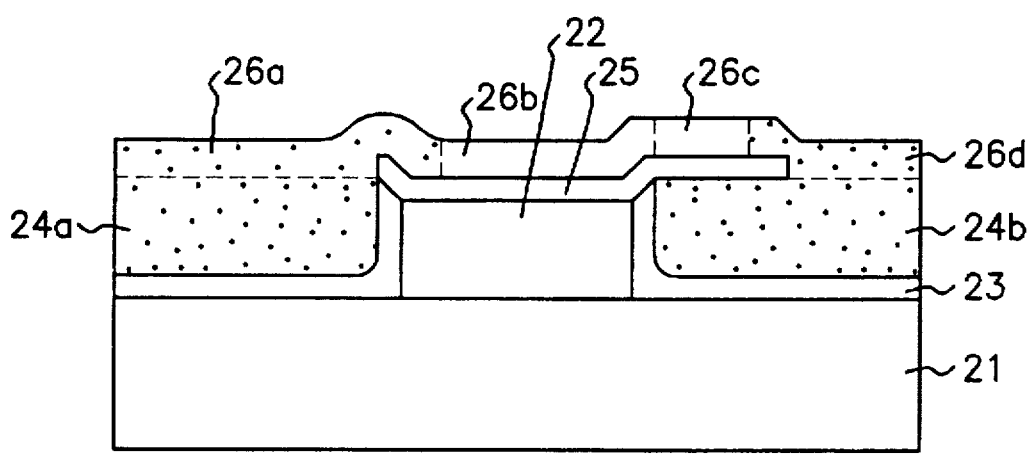

Finally, a thermal treatment process is performed to diffuse the dopants contained in the doped polysilicon films 24a and 24B into the amorphous polysilicon film 26, thereby forming source regions 24a and 26b and drain regions 24b and 26d, as shown in FIG. 2F. Of the amorphous polysilicon film 26, the regions into which the dopants are not diffused function as a channel region 26b and a drain offset region 26c. In addition, it is possible to form a source overlap structure by controlling the diffusing time of the dopants.

As described hereinbefore, without formation of a source/drain mask and ion implantation, it is possible to form the source/drain region and drain offset structure of a thin film transistor, in accordance with the present invention and thus, thereby simplifying the overall procedure. Further, the use of the doped polysilicon film in forming the source/drain region has an effect of significantly lowering both the resistance of the source/drain region and the resistance of Vcc line (channel poly). Accordingly, the properties of the thin film transistor are improved and the potential drop between the opposite ends of Vcc line can be prevented.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for fabricating a thin film transistor, comprising the steps of:

forming a gate electrode;

forming a doped polysilicon layer for a source region and a drain region at the side wall of the gate electrode, to insulate the gate electrode;

forming a gate insulating film extended overlying a portion of the doped polysilicon layer for the drain region, thereby forming a resulting structure;

forming an amorphous silicon layer over the resulting structure; and forming the source region and the drain region by diffusing dopants of the doped polysilicon layer into the amorphous silicon layer, whereby a drain offset region is formed directly over the gate insulating film which is extended to the drain region.

2. A method in accordance with claim 1, wherein said forming step of a doped polysilicon layer further comprises depositing an interlayer insulating film over the gate electrode, depositing the doped polysilicon layer, etching the doped polysilicon layer to expose the interlayer insulating film covering the upper surface of the gate electrode; and removing the exposed interlayer insulating film.

3. A method in accordance with claim 1, wherein said dopants of the doped polysilicon layer are diffused into said amorphous silicon layer to form a source overlap structure.

* * * * *